United States Patent

Nakazawa

(10) Patent No.: US 6,703,695 B2
(45) Date of Patent: Mar. 9, 2004

(54) SEMICONDUCTOR DEVICE AND METHOD FOR PRODUCING THE SAME

(75) Inventor: Yasutoshi Nakazawa, Sakurai (JP)

(73) Assignee: Sharp Kabushiki Kaisha, Osaka (JP)

(*) Notice: Subject to any disclaimer, the term of this patent is extended or adjusted under 35 U.S.C. 154(b) by 0 days.

(21) Appl. No.: 10/392,212

(22) Filed: Mar. 19, 2003

(65) Prior Publication Data

US 2003/0178712 A1 Sep. 25, 2003

(30) Foreign Application Priority Data

Mar. 22, 2002 (JP) ........................................ 2002-081083

(51) Int. Cl.[7] .............................................. H01L 23/495
(52) U.S. Cl. ........................ 257/676; 257/672; 257/673; 257/666
(58) Field of Search ................................ 257/666, 672, 257/673, 676

(56) References Cited

U.S. PATENT DOCUMENTS

| | | | | |
|---|---|---|---|---|
| 5,019,893 A | * | 5/1991 | Frank et al. ................. | 257/676 |
| 5,313,095 A | * | 5/1994 | Tagawa et al. .............. | 257/672 |
| 5,530,284 A | * | 6/1996 | Bailey ........................ | 257/670 |
| 5,792,676 A | * | 8/1998 | Masumoto et al. .......... | 438/111 |
| 5,798,571 A | * | 8/1998 | Nakajima ................... | 257/784 |
| 5,808,325 A | * | 9/1998 | Webb .......................... | 257/99 |
| 5,903,050 A | * | 5/1999 | Thurairajaratnam et al. ..... | 257/695 |
| 5,973,388 A | * | 10/1999 | Chew et al. ................. | 257/676 |
| 6,215,174 B1 | * | 4/2001 | Takada et al. .............. | 257/666 |
| 6,307,272 B1 | * | 10/2001 | Takahashi et al. .......... | 257/787 |
| 6,376,902 B1 | * | 4/2002 | Arndt ......................... | 257/678 |
| 6,465,875 B2 | * | 10/2002 | Connah et al. ............. | 257/666 |

FOREIGN PATENT DOCUMENTS

| | | | | |
|---|---|---|---|---|
| JP | 61016557 | | 1/1986 | |
| JP | 62-5650 | * | 1/1987 | ................. 257/676 |
| JP | 2001 102622 | | 4/2001 | |

* cited by examiner

*Primary Examiner*—Jasmine Clark
(74) *Attorney, Agent, or Firm*—Edwards & Angell, LLP; David G. Conlin; George W. Hartnell, III

(57) ABSTRACT

The semiconductor device is composed of a semiconductor die 1, and a lead frame 7 equipped with a die paddle 2 for mounting the semiconductor die and lead terminals 3, 4, 5, 6 for external connections, with the die paddle 2 and die paddle-side ends of the lead terminals 3, 4, 5, 6 being encapsulated together in a plastic package. The die paddle 2 is provided with links 14, 15, 16 which extend one by one between the lead terminals 3, 4, 5, 6. The extreme end of each link 14, 15, 16 is joined with adjacent lead terminals. The semiconductor die 1 is electrically connected with some of the lead terminals which correspond to a wiring pattern of an external circuit. Any of the links 14, 15, 16 uninvolved in the electrical connections is cut off.

4 Claims, 8 Drawing Sheets

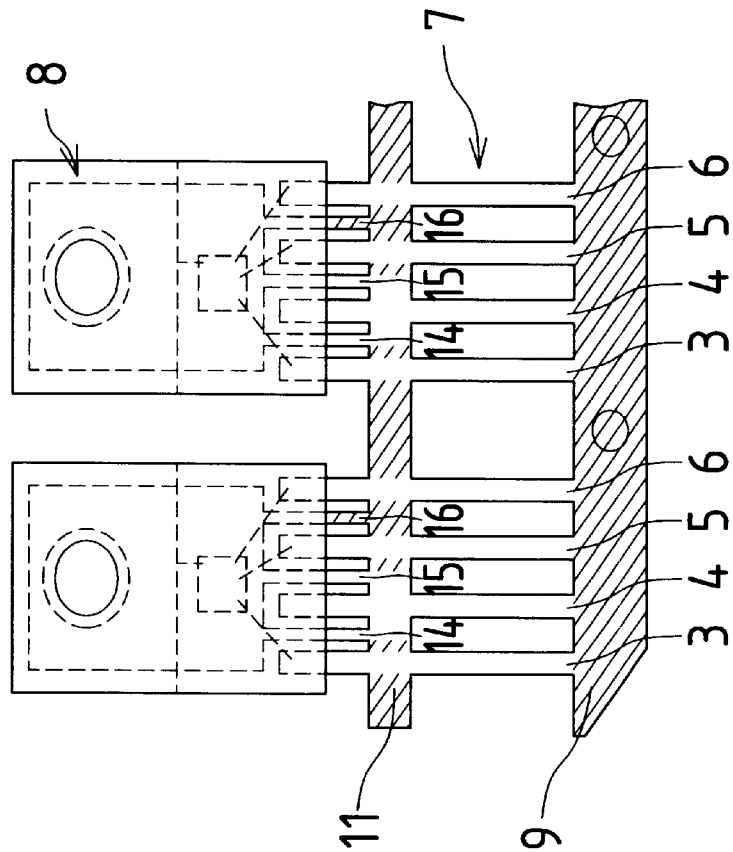
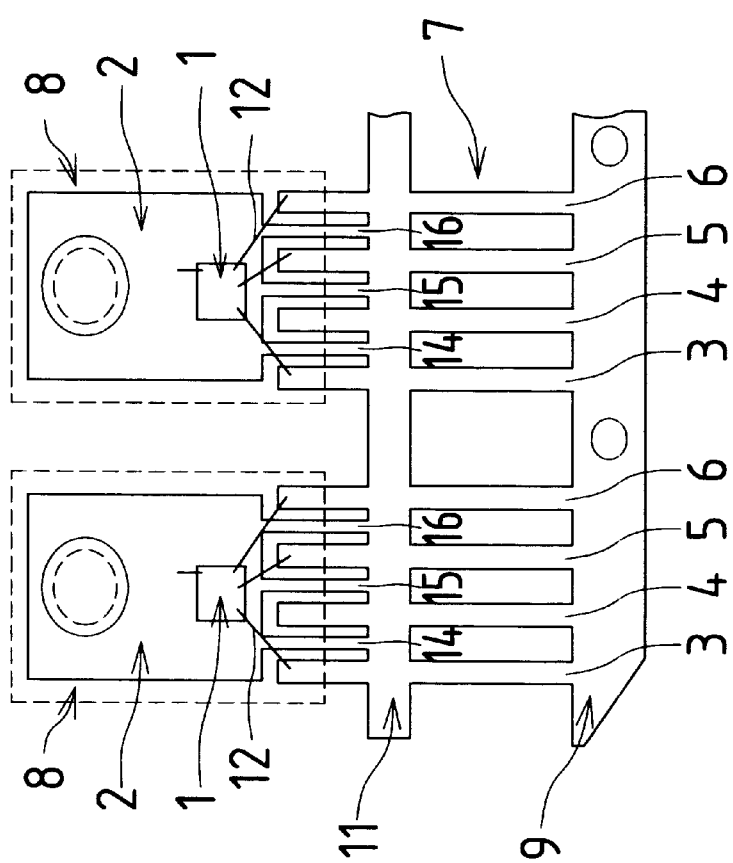
Fig.1(a)
Fig.1(b)

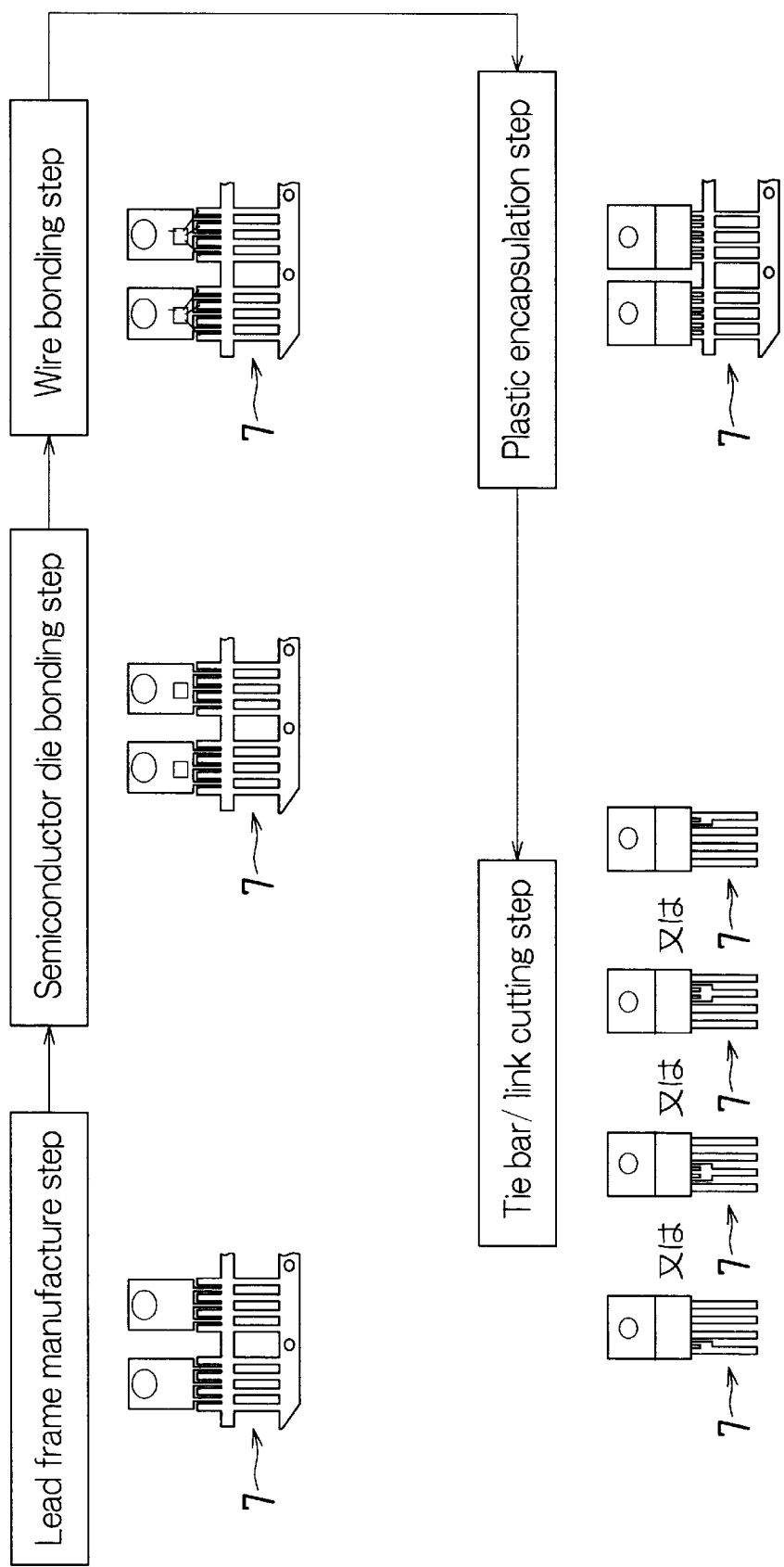

SEMICONDUCTOR DEVICE AND METHOD FOR PRODUCING THE SAME

BACKGROUND OF THE INVENTION

The present invention relates to a semiconductor device and a method for producing the same. In particular, the invention relates to a semiconductor device which is flexibly adapted to a circuit wiring pattern on the printed circuit board for mounting the semiconductor device, and a method for producing this semiconductor device.

RELATED ART

FIG. 4(a) is a plan view showing typical conventional semiconductor devices. Each semiconductor device is composed of a semiconductor die 1, and a lead frame 7 equipped with a die paddle 2 for mounting the semiconductor die 1 and four lead terminals 3, 4, 5, 6 for external connections. The die paddle 2 is joined with and supported by the lead terminal 4. This die paddle 2 and portions of the lead terminals 3, 4, 5, 6 are encapsulated in a plastic package 8.

In the lead frame 7, the lead terminals 3, 4, 5, 6 are tied together at the middle by a tie bar 11, with one end of each lead terminal being joined with and supported by a cross rail 9. The cross rail 9 holds a plurality of lead frames 7 side by side. In each lead frame 7, one end of the die paddle 2 is joined with and supported by the cross rail 9 via the lead terminal 4, and the other end of the die paddle 2 is joined with and supported by another cross rail 10. Similarly, the cross rail 10 holds the lead frames 7 side by side.

FIG. 4(b) is a plan view showing a different type of conventional semiconductor devices. In each semiconductor device shown in FIG. 4(b), the die paddle 2 is joined with and supported by the cross rail 9 via the terminal lead 5, not via the terminal lead 4 as in the semiconductor devices of FIG. 4(a).

A method for producing the conventional semiconductor devices shown in FIG. 4(a) is described with reference to FIG. 5 and FIG. 6.

To start with, a semiconductor die 1 is bonded to the die paddle 2 in each lead frame 7 (see FIG. 5).

Next, the semiconductor die 1 is connected to the lead terminals 3, 5, 6 and the die paddle 2 by bonding wires 12 in order to form a circuit. The reverse face of the semiconductor die 1 is also electrically connected to the die paddle 2.

Then, the lead frame 7 is encapsulated in a plastic package 8 by transfer molding, etc. Finally, the cross rails 9, 10 and the tie bar 11 are cut off to give a semiconductor device (see FIG. 6).

A production line for these conventional semiconductor devices is shown by the flowchart in FIG. 7. The production line proceeds continuously from the lead frame manufacture step, to the semiconductor die bonding step, to the wire bonding step, to the plastic encapsulation step, and ends with the tie bar cutting step. This production line is individually set up for lead frames of every shape. For example, since the shapes of lead frames 7 are different between the semiconductor devices shown in FIG. 4(a) and FIG. 4(b), these devices adopt individual specifications (dies, etc.) in the lead frame manufacture step. The difference in the lead frame shape necessitates modification of specifications not only in the lead frame manufacture step, but also in the semiconductor die bonding step, the wire bonding step, the plastic encapsulation step, and the tie bar cutting step. Eventually, there should be as many production lines as the shapes of lead frames.

This issue is discussed in more detail. FIG. 8 illustrates how a conventional semiconductor device is mounted on a printed circuit board. Taking the semiconductor device shown in FIG. 4(a) as an example, the lead frame 7 is equipped with the lead terminal 3 as an input voltage terminal, the lead terminal 4 as an output voltage terminal, the lead terminal 5 as a GND terminal, and the lead terminal 6 as an output voltage control terminal. In order to mount this semiconductor device on a printed circuit board 13, the circuit wiring on the printed circuit board 13 needs to be adapted to the lead terminal arrangement in the semiconductor device, as illustrated in FIG. 8. Thus, a printed circuit board has to be designed to the lead terminal arrangement in the semiconductor device.

Alternatively, the terminal arrangement in the semiconductor device may be altered to match the circuit wiring on the circuit board. For example, where the output voltage terminal and the GND terminal need to be changed merely between each other (specifically speaking, where it is necessary to turn the lead terminal 4 into a GND terminal and the lead terminal 5 into an output voltage terminal), another semiconductor device has to be produced with use of the lead frame 7 shown in FIG. 4(b). Since the lead frames 7 of FIG. 4(a) and FIG. 4(b) are different in shape, an additional production line should be set up for the latter lead frame 7. In this case, too, there should be as many production lines as the shapes of lead frames.

Apart from these disadvantages, the conventional semiconductor device suffers from other problems. In one respect, the die paddle 2 may bend during in-line transfer or the like in the production of the semiconductor device, in which case the die paddle 2 causes troubles in the production process. Therefore, before the production of the conventional semiconductor device, the lead frame 7 is constructed to prevent bending of the die paddle 2, with the die paddle 2 being joined with and supported by the cross rail 10 in advance. In another respect, from the viewpoint of reducing the material cost for the lead frame 7, it is necessary to minimize extra portions which are cut off in the tie bar cutting step. This requirement leads to a lead frame 7 which omits the cross rail 10, the most part of which is eventually removed. Nevertheless, if the cross rail 10 is omitted in the lead frame 7 of FIG. 4(a), the die paddle 2 is supported by the lead terminal 4 alone and shows a less strength against bending. As mentioned above, the conventional semiconductor devices are confronted with the difficulty in maintaining the strength of lead frames as well as reducing the material cost therefor.

SUMMARY OF THE INVENTION

In order to solve these problems, the present invention aims to provide a semiconductor device which enables efficient rearrangement of lead terminals, which maintains the strength of a die paddle during the production process as well as reduces the material cost for a lead frame, and which is obtained by a single production line. The invention also aims to provide a method for producing this semiconductor device.

In order to achieve the above objects, a semiconductor device according to the invention comprises a semiconductor die, and a lead frame equipped with a die paddle for mounting the semiconductor die and a plurality of lead terminals for external connections, the die paddle and die paddle-side ends of the lead terminals being encapsulated together in a plastic package. In this semiconductor device, the die paddle is provided with a plurality of links which extend one by one between the lead terminals, with an extreme end of each link being integrated with adjacent lead terminals. The semiconductor die is electrically connected to part of the lead terminals which correspond to a wiring pattern of an external circuit, and any link uninvolved in such electrical connections is cut off.

According to this invention, the die paddle is provided with the links which extend one by one between the lead terminals, with an extreme end of each link being integrated with adjacent lead terminals. Hence, the die paddle can maintain a sufficient strength to resist bending during the production of a semiconductor device, without resorting to a cross rail which is joined with the die paddle as a support. Besides, the semiconductor die is electrically connected to part of the lead terminals which correspond to a wiring pattern of an external circuit, and any link uninvolved in the electrical connections is cut off. As a result, it is possible to provide a semiconductor device whose terminal arrangement is adaptable to the circuit wiring on the printed circuit board.

In this semiconductor device, the links and the lead terminals may be integrated via a tie bar which ties the lead terminals.

This feature can materialize a lead frame in a simple structure. Also, the die paddle can maintain a sufficient strength to resist bending during the production of a semiconductor device, without resorting to a cross rail which is joined with the die paddle as a support.

In the above semiconductor device, the links and the lead terminals may be integrated outside of the plastic package.

According to this feature, the links and the lead terminals are integrated outside of the plastic package, so that any link can be cut off after the plastic encapsulation.

The present invention also provides a method for producing the above semiconductor device, which comprises the steps of: manufacturing the lead frame which is equipped with a die paddle for mounting a semiconductor die and a plurality of lead terminals for external connections, the die paddle being provided with a plurality of links which extend one by one between the lead terminals, with an extreme end of each link being integrated with adjacent lead terminals (the lead frame manufacture step); attaching the semiconductor die on the die paddle by bonding (the semiconductor die bonding step); electrically connecting the semiconductor die, by wire bonding, to part of the lead terminals which correspond to a wiring pattern of an external circuit board for mounting the semiconductor device (the wire bonding step); encapsulating the die paddle and die paddle-side ends of the lead terminals together in a plastic package (the plastic encapsulation step); and cutting off the tie bar and the links at a part uninvolved in any such electrical connections (the tie bar/link cutting step).

According to this semiconductor device production method, the tie bar/link cutting step allows simultaneous removal of the tie bar and the links at a part uninvolved in the above electrical connections. In this case, all lead frames can be manufactured in an identical shape in the lead frame manufacture step and can be processed in the same shape until the tie bar/link cutting step. Then, these uniform lead frames undergo the tie bar/link cutting step for removing any link uninvolved in the above electrical connections, so that the lead frames can be individually shaped and adapted to a variety of circuit wiring patterns. Thus, semiconductor devices with different terminal arrangements can be also produced in a single production line.

In the method for producing a semiconductor device according to the present invention, the tie bar/link cutting step may be carried out after the plastic package is formed in the plastic encapsulation step.

This feature can protect the bonding wires from being severed, deformed or damaged otherwise by the link cutting die, so that the bonding wires can ensure electrical connections between the lead terminals and the semiconductor die.

BRIEF DESCRIPTION OF THE DRAWINGS

FIGS. 1(*a*), (*b*) are plan views showing the semiconductor devices according to an embodiment of the present invention.

FIG. 2 is a flowchart showing a production line for the semiconductor devices according to an embodiment of the present invention.

DESCRIPTION OF PREFERRED EMBODIMENTS

Figure 3:
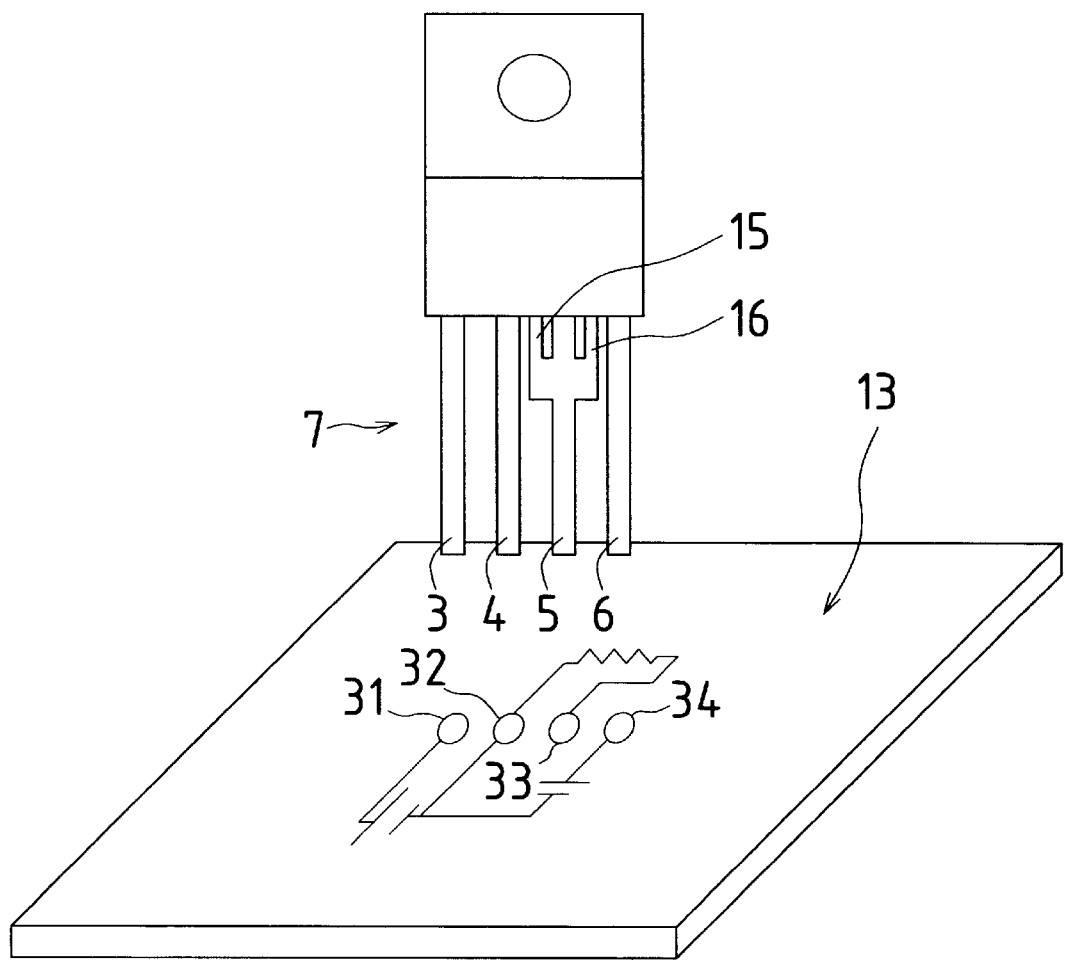
FIG. 3 illustrates how the semiconductor device according to an embodiment of the present invention is mounted on a printed circuit board.

An embodiment of the present invention is hereinafter described with reference to the accompanying drawings. In the following description, the same elements as mentioned during the description of the related art are designated by the same reference numerals.

FIGS. 1(*a*), (*b*) are plan views showing the semiconductor devices according to an embodiment of the present invention.

Each semiconductor device is composed of a semiconductor die 1, and a lead frame 7 equipped with a die paddle 2 for mounting the semiconductor die and four lead terminals 3, 4, 5, 6 for external connections. The die paddle 2 and die paddle-side ends of the lead terminals 3, 4, 5, 6 are encapsulated together in a plastic package 8.

In the lead frame 7, the other ends of the lead terminals 3, 4, 5, 6 are joined with and supported by a cross rail 9, which holds a plurality of lead frames 7 side by side. The numeral 11 indicates a tie bar.

The die paddle 2 is provided with links 14, 15, 16 which extend one by one between the lead terminals 3, 4, 5, 6. The extreme ends of the links 14, 15, 16 are integrated with the adjacent lead terminals 3, 4, 5, 6 via the tie bar 11. The lead terminals 3, 4, 5, 6 and the links 14, 15, 16 are arranged to integrate outside of the plastic package.

When the links 14, 15, 16 are joined with the lead terminals 3, 4, 5, 6 via the tie bar 11, the lead frame 7 can be made in a simple structure. Besides, although one end of the die paddle is not joined with or supported by a traditional cross rail, this structure can maintain the strength of the die paddle against bending which may occur during the semiconductor device production process.

Among the lead terminals 3, 4, 5, 6, those corresponding to a wiring pattern of an external circuit are electrically connected to the semiconductor die 1 by bonding wires 12. As for the links 14, 15, 16, any link uninvolved in such electrical connections is cut off.

Referring to FIG. 1(b) as an example, the shaded area in the lead frame 7 represents the part to be removed from the tie bar 11, the link 16 and the cross rail 9, with a proviso that the lead terminal 4 is joined with the die paddle 2. In FIG. 1(b), the links 14, 15 are retained and the link 16 is cut off. In this case, only the lead terminal 4 is joined with the die paddle 2 via the tie bar 11 and the links 14, 15. The resulting lead frame 7 is similar to the conventional lead frame 7 illustrated in FIG. 4(a).

In contrast to the conventional lead frames 7, the lead frame 7 employed in this embodiment does not have a cross rail 10 which is joined with the die paddle 2 as a support. Even without a cross rail 10, the strength of the lead frame 7 can be maintained by means of the links 14, 15, 16 which are integrated with the tie bar 11. Besides, by eliminating a traditional cross rail which is joined with the die paddle as a support, it is possible to reduce the material cost for the lead frame 7. In fact, the total cost relating to this embodiment is lower than in the conventional cases, even including the cost for the links which substitute the traditional cross rail.

Next, the process for producing the semiconductor device of the above structure is described with reference to FIG. 2. FIG. 2 is a flowchart showing the steps for producing the semiconductor device according to the present embodiment.

Similar to the known process as mentioned above, this production process includes the lead frame manufacture step for preparing the lead frame 7, the semiconductor die bonding step, the wire bonding step, the plastic encapsulation step, and the tie bar cutting step, which are performed in the order mentioned. The only exception is to incorporate a tie bar/link cutting step, instead of the tie bar cutting step in the known method.

In the conventional lead frame manufacture step, a lead frame is made in a predetermined shape which is determined by the lead terminal arrangement in a semiconductor device. In contrast, this embodiment requires manufacture of only one type of lead frame 7 (as shown in FIG. 1), irrespective of the lead terminal arrangement. Hence, several kinds of lead frames 7 can be manufactured with use of a single type of punching die, without the need for changing punching dies.

Following the lead frame manufacture step, the process for the semiconductor device production continues to the die bonding step where a semiconductor die 1 is attached to each die paddle 2; the wire bonding step where the semiconductor die 1 is electrically connected to lead terminals which correspond to a wiring pattern on the external printed circuit board for mounting the semiconductor device; the plastic encapsulation step where the die paddle 2 and the die paddle-side ends of the lead terminals 3, 4, 5, 6 are encapsulated together in a plastic package; and the tie bar/link cutting step for cutting off the tie bar 11 and the links at a part which is uninvolved in the electrical connections between the semiconductor die 1 and any of the lead terminals 3, 4, 5, 6 which correspond to the wiring pattern of the external circuit. In the example of a four-terminal semiconductor device shown in FIG. 2, one of the four lead terminals is selected as the one to be joined with the die paddle 2, and any link uninvolved in the circuit wiring can be cut off such that the selected lead terminal can be joined with the die paddle 2. Moreover, the same cutting die can be also employed to remove a different link or links. This is simply done by shifting the set position of the lead frame 7 relative to the cutting die.

With regard to the tie bar/link cutting step for removing the tie bar and the links at a part which is uninvolved in the circuit wiring, the cutting is effected in two patterns. For one, where the lead terminal is joined with the die paddle 2 via the adjacent links which locate on both sides, the cutting is conducted to retain the adjacent links and to remove the other link. For another, where the lead terminal is joined with the die paddle 2 via only one link which locates on either side, the cutting is conducted to retain the adjacent link and to remove the other links (see the tie bar/link cutting step in FIG. 2). Take FIG. 1(b) as a specific example. In order to join the die paddle 2 with the lead terminal 3 via the adjacent link 14 which locates on one side alone, the links 15, 16 and the tie bar 11 are removed in such a manner as to retain the adjacent link 14. On the other hand, in order to join the die paddle 2 with the lead terminal 4 via the links 14, 15 which locate on both sides, the link 16 and the tie bar 11 are removed in such a manner as to retain the adjacent links 14, 15.

Further, the tie bar/link cutting step is carried out after the plastic encapsulation step. In theory, any unnecessary link should be removed between the wire bonding step and the plastic encapsulation step for the purpose of preventing the die paddle 2 from bending in the semiconductor device production process. If this procedure is put into practice, however, the link cutting die is likely to sever, deform or otherwise damage the bonding wires. For this reason, it is desirable to remove an unnecessary link or links after the resin encapsulation step.

Additionally, removal of an unnecessary link or links coincides with removal of the tie bar 11, after the resin encapsulation. This procedure is efficient because those parts can be cut off in one step with a single cutting die.

Now, turning to FIG. 3 and FIG. 4, the manner of mounting the above semiconductor device on a printed circuit board is described in comparison with the case of a conventional semiconductor device.

Figure 4A:
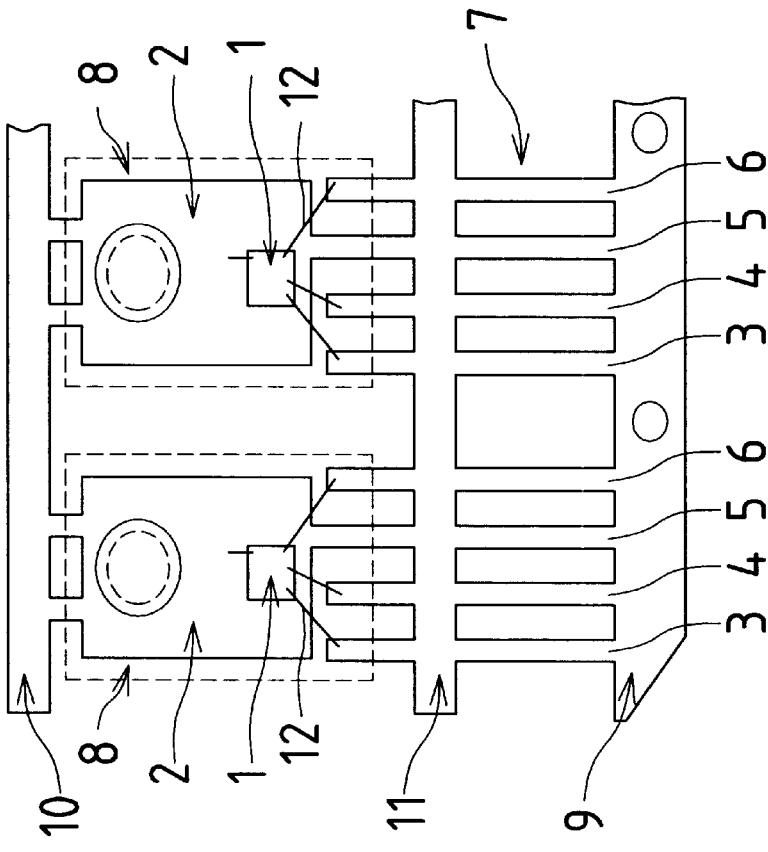
FIG. 4(*a*) is a plan view showing conventional semiconductor devices, and FIG. 4(*b*) is a plan view showing other conventional semiconductor devices.
Figure 4B:
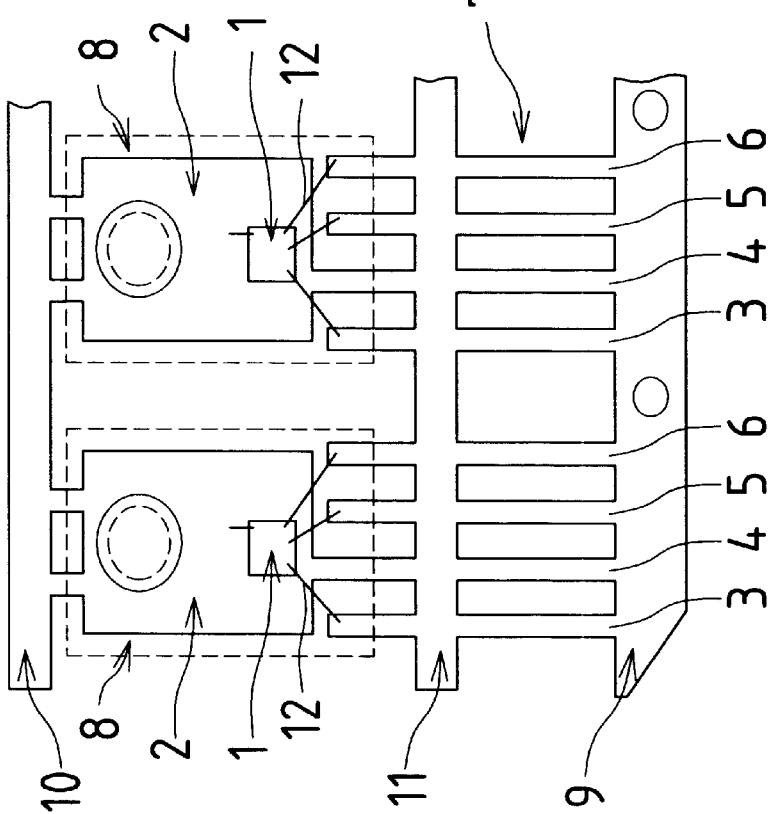
Figure 5:
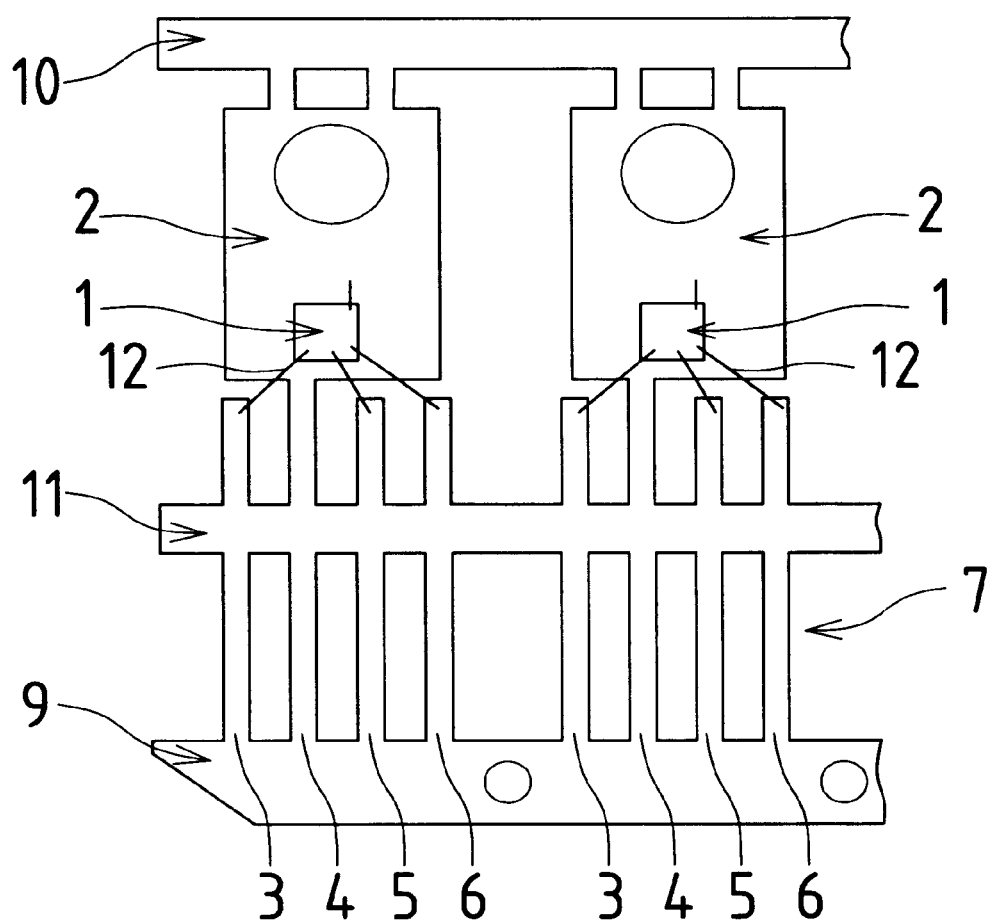
FIG. 5 illustrates a manner for producing conventional semiconductor devices.
Figure 6:
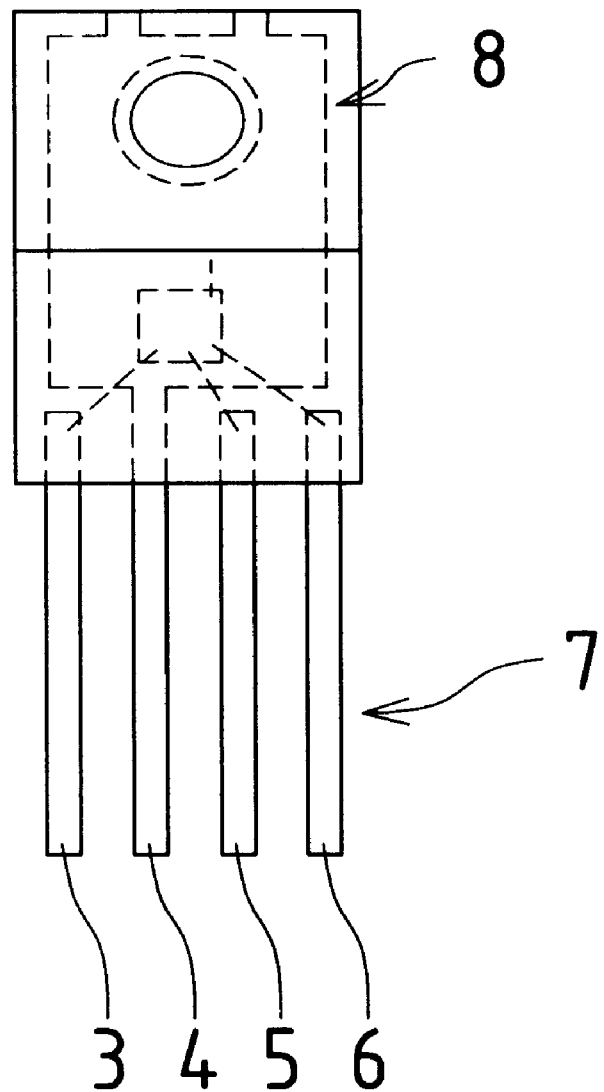
FIG. 6 is an external view of a conventional semiconductor device.
Figure 7:
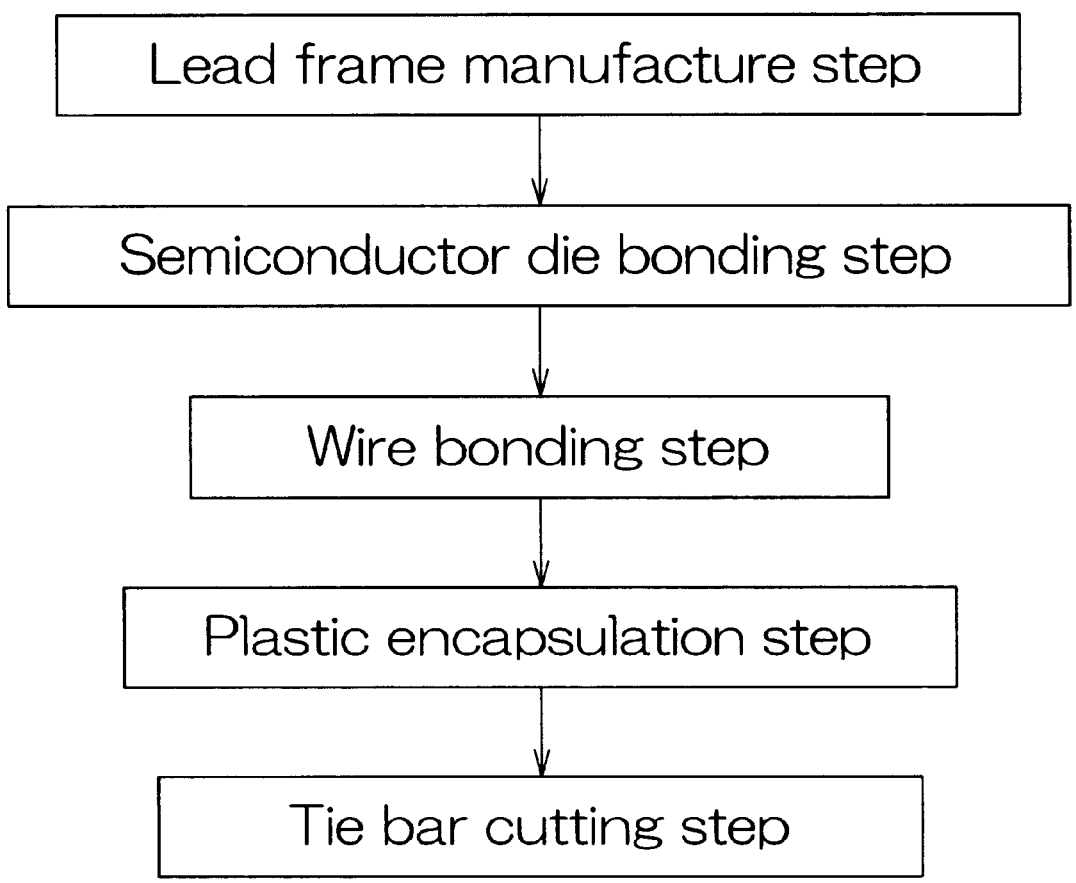
FIG. 7 is a flowchart showing a production line for conventional semiconductor devices.
Figure 8:
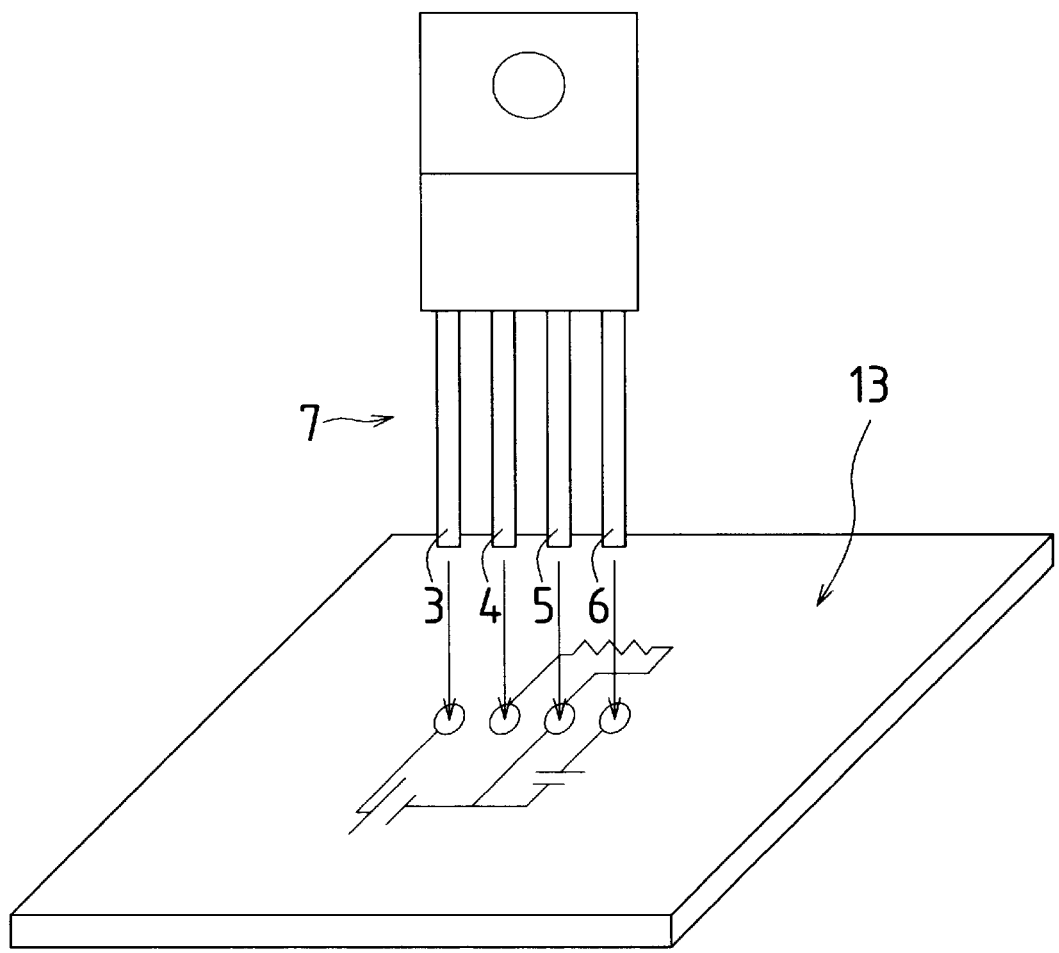
FIG. 8 illustrates how a conventional semiconductor device is mounted on a printed circuit board.

By way of illustration, a conventional semiconductor device is presumed to employ the lead frame 7 which is joined with the die paddle 2 via the lead terminal 4, as depicted in FIG. 4(a). In this lead frame, the lead terminal 3 is an input voltage terminal, the lead terminal 4 is an output voltage terminal, the lead terminal 5 is a GND terminal, and the lead terminal 6 is an output voltage control terminal. However, the semiconductor device with this type of lead frame cannot be mounted on a printed circuit board if the circuit wiring is already designed as shown in FIG. 3, wherein a hole 31 corresponds to an input voltage terminal, a hole 32 to a GND terminal, a hole 33 to an output voltage terminal, and a hole 34 to an output voltage control terminal. As far as the conventional semiconductor device is concerned, it is necessary to manufacture an alternative lead frame 7, as shown in FIG. 4(b), which is adapted to this circuit wiring.

In contrast, the semiconductor device of the present embodiment can be mounted on the circuit board with the circuit wiring of FIG. 3, without using an alternative lead frame 7 nor changing the design of the circuit board. This is done by rearranging the terminal leads in the semiconductor device in the following manner.

To start with, concerning the semiconductor device in FIG. 1(a), the semiconductor die 1 is connected by a bonding wire 12 to the lead terminal 4, instead of the lead terminal 5. After completion of the plastic encapsulation step, the tie bar/link cutting step is carried out to remove the tie bar 11 and the link 14, while retaining the links 15, 16 which locate on both sides of the lead terminal 5. The thus obtained semiconductor device has a desired terminal arrangement and can be mounted on the circuit board as shown in FIG. 3.

In the foregoing embodiment of the present invention, the semiconductor device is represented by the one with four lead terminals. Nevertheless, the semiconductor device should not be limited to the four-terminal device, but suitably applicable to any semiconductor device equipped with three or more lead terminals.

The invention may be embodied in other specific forms without departing from the spirit or essential characteristics thereof. The above embodiment is therefore to be considered in all respects as illustrative and not restrictive, the scope of the invention being indicated by the appended claims rather than by the foregoing description. All changes which come within the meaning and range of equivalency of the claims are therefore intended to be embraced therein.

This application is based on Patent Application No. 2002-081083 filed in Japan, the contents of which are incorporated hereinto by reference. Likewise, the contents of all references cited herein are incorporated hereinto by reference.

What is claimed is:

1. A semiconductor device which comprises a semiconductor die, and a lead frame equipped with a die paddle for mounting the semiconductor die and a plurality of lead terminals for external connections, the die paddle and die paddle-side ends of the lead terminals being encapsulated together in a plastic package, wherein the die paddle is provided with a plurality of links which extend one by one between the lead terminals, with an extreme end of each link being integrated with adjacent lead terminals;

the semiconductor die is electrically connected to part of the lead terminals which correspond to a wiring pattern of an external circuit; and any link uninvolved in such electrical connections is cut off.

2. A semiconductor device according to claim 1, wherein the links and the lead terminals are integrated via a tie bar which ties the lead terminals.

3. A semiconductor device according to claim 1, wherein the links and the lead terminals are integrated outside of the plastic package.

4. A semiconductor device according to claim 2, wherein the links and the lead terminals are integrated outside of the plastic package.

* * * * *